(12) United States Patent
Berkens et al.

(10) Patent No.: US 8,151,234 B2
(45) Date of Patent: Apr. 3, 2012

(54) METHOD FOR OPTIMIZING AN INTEGRATED CIRCUIT PHYSICAL LAYOUT

(75) Inventors: Martinus Maria Berkens, Eindhoven (NL); Simon Johannes Klaver, Weert (NL)

(73) Assignee: Takumi Technology Corporation, Sunnyvale, CA (US)

( * ) Notice: Subject to any disclaimer, the term of this patent is extended or adjusted under 35 U.S.C. 154(b) by 207 days.

(21) Appl. No.: 12/306,340

(22) PCT Filed: Jun. 27, 2007

(86) PCT No.: PCT/NL2007/050312
§ 371 (c)(1),
(2), (4) Date: Jul. 2, 2009

(87) PCT Pub. No.: WO2008/002136
PCT Pub. Date: Jan. 3, 2008

(65) Prior Publication Data
US 2010/0146465 A1    Jun. 10, 2010

(30) Foreign Application Priority Data
Jun. 27, 2006   (EP) .................................... 06076308

(51) Int. Cl.
*G06F 17/50* (2006.01)
(52) U.S. Cl. ........................................ 716/119; 716/120
(58) Field of Classification Search ........... 716/119–123
See application file for complete search history.

(56) References Cited

U.S. PATENT DOCUMENTS

| | | | |
|---|---|---|---|
| 6,189,132 B1 * | 2/2001 | Heng et al. ................... | 716/122 |
| 6,738,954 B1 | 5/2004 | Allen et al. | |
| 7,065,729 B1 * | 6/2006 | Chapman ...................... | 716/129 |
| 7,266,803 B2 * | 9/2007 | Chou et al. ...................... | 716/51 |
| 2002/0026621 A1 | 2/2002 | Mukai | |
| 2004/0133871 A1 | 7/2004 | Granik et al. | |
| 2004/0230922 A1 | 11/2004 | Allen et al. | |
| 2005/0028129 A1 | 2/2005 | Hsu et al. | |
| 2005/0177810 A1 | 8/2005 | Heng et al. | |
| 2006/0095877 A1 | 5/2006 | Su et al. | |
| 2006/0123380 A1 | 6/2006 | Ikeuchi | |
| 2007/0136714 A1 | 6/2007 | Cohn et al. | |

OTHER PUBLICATIONS

Olivier et al: "Concurrent wire spreading, widening, and filling" Proc Des Autom Conf; Proceedings—Design Automation Conference; 2007 44th ACM/IEEE Design Automation Conference, DAC'07 2007, pp. 350-353, XP002447210 abstract; section 2.

(Continued)

*Primary Examiner* — Jack Chiang
*Assistant Examiner* — Binh Tat
(74) *Attorney, Agent, or Firm* — Leydig, Voit & Mayer Ltd.

(57) ABSTRACT

The invention relates to a method of optimizing an integrated circuit layout, wherein an initial integrated circuit layout is provided. A predetermined set of physical characteristics of a predetermined set of polygons of said initial circuit layout, is assessed and said physical characteristics are aggregated to derive an integral quality number associated to said initial circuit layout. According to the invention, cost functions are generated to evaluate a perturbed quality number of said perturbed layout and layout perturbations are selected that optimize the quality number, so that the circuit layout is optimized.

18 Claims, 7 Drawing Sheets

OTHER PUBLICATIONS

Chiluvuri et al: "Layout-Synthesis Techniques for Yield Enhancement" IEEE Transactions on Semiconductor Manufacturing, IEEE Service Center, Piscataway, NJ, US, vol. 8, No. 2, May 1995, pp. 178-187, XP002312711 ISSN: 0894-6507 abstract; sections II and III.

Poonawala et al: "OPC and PSM design using inverse lithography: A non-linear optimization approach" Proceedings of the SPIE, SPIE, Bellingham, VA, US, vol. 6154, Feb. 2006, pp. 61543H-1, XP002408486 ISSN: 0277-786X abstract; section 1.2; p. 12, first paragraph.

International Search Report for PCT/NL2007/050312; dated Sep. 9, 2007.

Erdmann et al.; "Mask and Source Optimization for Lithographic Imaging System:" The International Society for Optical Engineering; vol. 5182, (Aug. 3, 2003), pp. 88-102.

Peng et al., "Fast Lithography Simulation under Focus Variations for OPC and Layout Optimizations" Proc of SPIE, vol. 6156, 615618 (Feb. 2006) *abstract* Sections 1 and 2.

* cited by examiner

OPC edge B    OPC edge A    Printed edge    IMIN    OPC edge C

METHOD FOR OPTIMIZING AN INTEGRATED CIRCUIT PHYSICAL LAYOUT

FIELD

The invention relates to a method of optimizing an integrated circuit layout.

BACKGROUND

In the art, before an integrated circuit is put into production, the physical layout thereof has to be checked whether it is fit for production. Generally, design-rule violations are checked (such as minimal distance or width requirements on wires) and, more recently, checking is performed whether manufacturing rules are satisfied (manufacturing rules will in general impose a preference for more than minimal distance in addition to the design-rules). Calculating a quality number for the layout, which quality number can be associated to a yield prediction value, can be seen as an advanced way of checking the layout before production: if the quality number is too bad one may opt to modify the design to get better manufacturing yield.

One publication that deals with calculating a yield prediction value is U.S. Pat. No. 6,738,954. In this publication, a quality number calculation is performed on a proposed layout. A number of subdivisions of a circuit are assessed each resulting in an average fault number and a statistical error value of said fault number. Iteratively, a statistical error of the average number is reduced until the statistical error is below an error limit.

U.S. Pat. No. 7,013,441 is another publication that is concerned with calculating a predicted manufacturing yield from an integrated circuit. Here, by selecting library elements from a design database to include in a proposed design for the integrated circuit, a yield is calculated based on a normalization factor that is associated to the library element and used to account for a sensitivity of the library element to a given defect.

U.S. Pat. No. 6,418,551 proposes a design rule checking tool that uses a waiver layout pattern in order to waive a suspected violation of a design rule in a proposed circuit layout. In this way, the number of violations that need assessment can be lowered.

These publications have in common that single quality number statements are given for pass/fail of a certain circuit layout. However, the information of that quality number is not used to propose a modified design.

In U.S. Pat. No. 6,745,372 a layout optimization is provided wherein a system simulates the effects of the manufacturing process on the target layout to produce a simulated printed image for the target layout. Accordingly, shapes in a target layout are moved to produce a new target layout that has better process latitude. The patent publication is involved with relaxing a design rule by assessing a change in a target layout. It is not concerned with calculating a quality number.

SUMMARY

It is desirable to provide an optimization of a layout of an integrated circuit wherein a quality number assessment is taken into account. According to an aspect of the invention, there is provided a method according to claim 1. In particular, according to said aspect, there is provided a method of optimizing a global integrated circuit layout comprised of a number of polygons having a predetermined geometrical relation relative to each other, comprising, comprising: providing an initial global integrated circuit layout; assessing local quality numbers, each as a function of a local pattern of shapes in said initial circuit layout, aggregating approximated functions of said local quality numbers to derive an integral quality number associated to said initial global circuit layout; perturbing said integral quality number by varying said global circuit layout; and selecting perturbations that optimize the quality number, so as to optimize said global circuit layout. Accordingly, a quality number assessment is provided, from which a modified design can be derived that has an improved quality number, in order to optimize the design in relation to a specific quality number assessment, such as a predicted manufacturing yield.

In another aspect there is provided a system. The system comprises an input, an output and a processor arranged to perform the method of claim 1.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
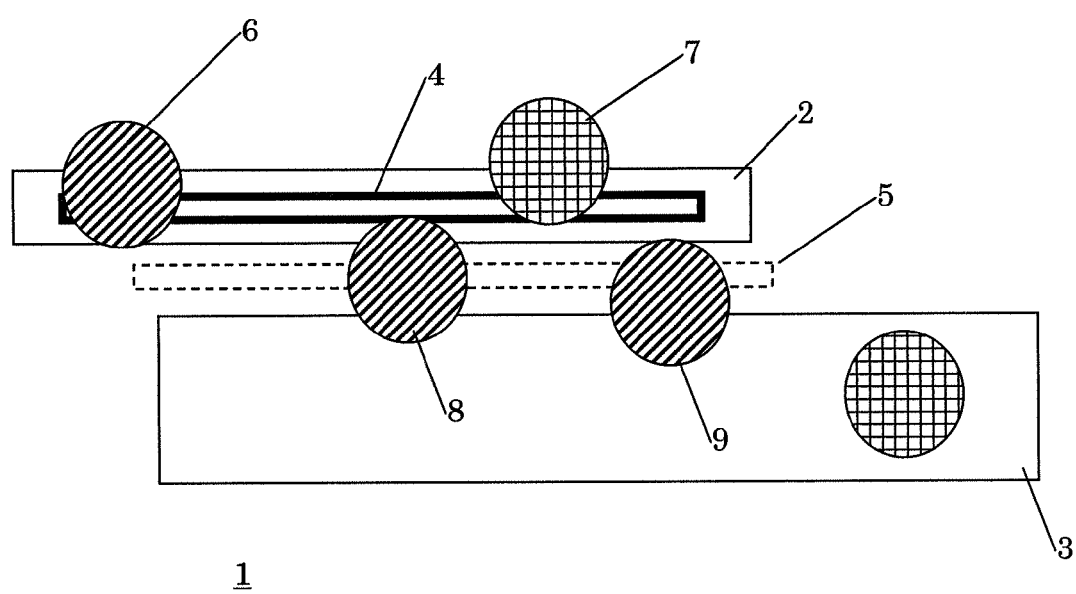
FIG. 1 illustrates schematically a critical area in a detail of an integrated circuit layout, showing potentially harmful and harmless particles.

Referring to FIG. 1 there is shown schematically a layout detail 1 of an integrated circuit. The detail comprises two adjacent metal tracks 2, 3. These tracks 2, 3 define critical areas 4, 5 to be considered critical for providing an electrical connection (area 4 on track 2), or electrical isolation (area 5 between tracks 2 and 3), to provide correct electrical functioning. The critical area is dependent on the size of the particle that is considered. Indeed, with a particle 6 dividing track 2 in half, the electrical connection is lost and a defect is likely to arise. In contrast, another particle 7 only partially covers the track, so that electrical connection is maintained. Other particles 8, 9 are shown to establish contact between the tracks 2, 3 so that these particles will likely result in defective functioning of the integrated circuit. In fabrication, particles with bigger sizes are less likely to exist, so increasing width or spacing will reduce the sensitivity to random defect related yield loss. A rating function models this probability P:

$$P(D)=P_0 * D^\alpha \qquad \text{Equation 1}$$

Where:
- P(D) is the particle occurrence probability
- $P_0$ is a user specified calibration probability (particles/area unit)
- D is the particle size.
- $\alpha$ is a user specified modelling constant (usually ranging between −1.5 and −2.5)

Figure 2:
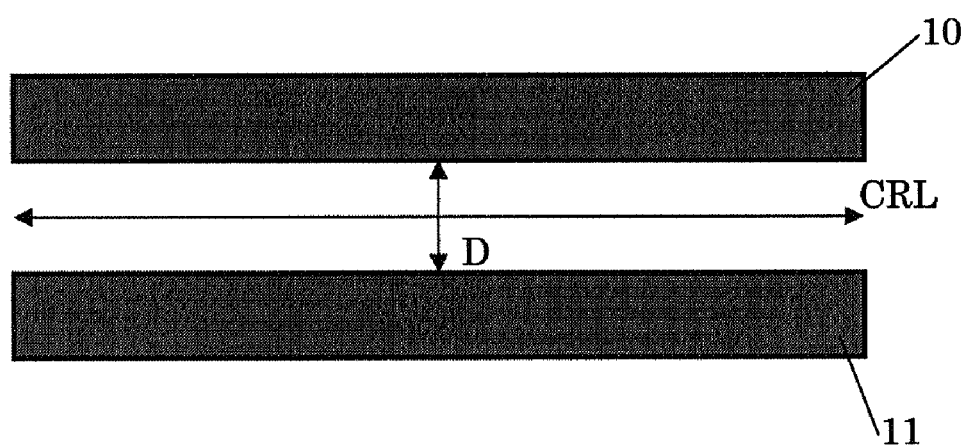
FIG. 2 illustrates the effect of a layout perturbation for two adjacent tracks in a layout detail.

In FIG. 2 a layout detail is shown in the form of two adjacent tracks 10, 11. For this layout, a probability of a short circuit between the tracks 10, 11 can be calculated or, in other words, a yield loss. This is an example of a cost function. For an entire layout, such physical characteristics, for example, the probability of a short circuit between two adjacent edges due to random particle defects, are aggregated to derive an integral quality number associated to the circuit layout.

Such cost functions can be used to model a wide variety of effects and can be generally seen as a quality number, for instance, for predicting a printing related yield (e.g. putting cost on bad contrast); random defect related yield (e.g. sensitivity to particles, or bad contacts); electrical properties (e.g. put cost on drain area's because it slows down circuit speed and increases power consumption); or mask making related cost (e.g. put cost on jogs in shape edges because it increases mask-fracture count, and mask writer time).

In particular, a schematic detail is given of adjacent metal strips 10, 11, having a common run length CRL and a particle size distribution model:

$$P(d) = P_0 * d^{-2} \qquad \text{Equation 2}$$

Note that here, referring to Equation 1, $\alpha$ is chosen to be −2. Accordingly, the probability of a short circuit between the tracks is approximately:

$$P(\text{short}) = CRL *_{D_0} \int^\infty P(S) \partial S = CRL * P_0/D. \qquad \text{Equation 3}$$

Figure 3:
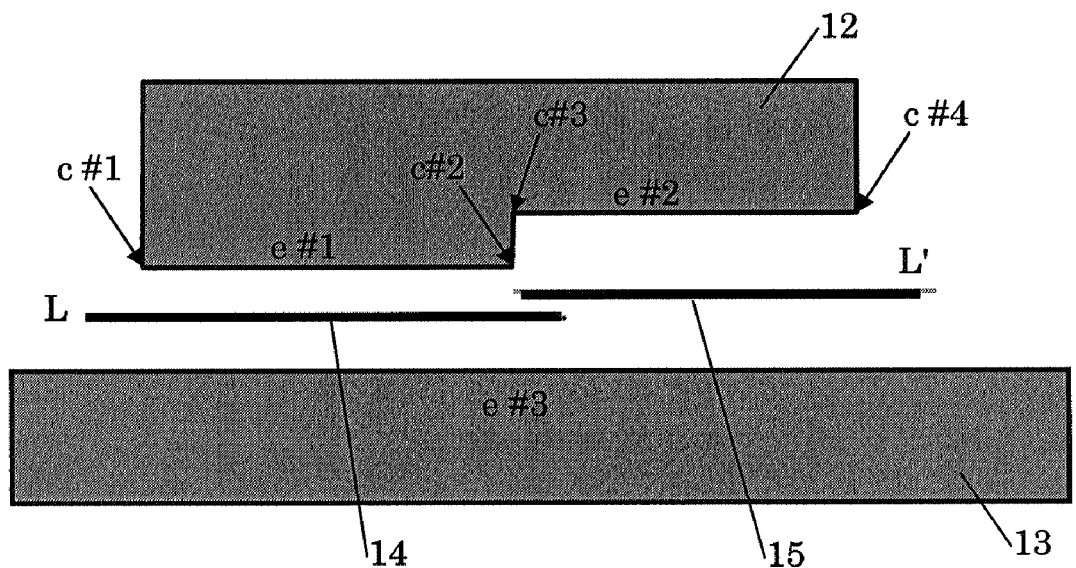
FIG. 3 shows schematically a critical area and dimensional characteristics used for calculating a cost function.

In FIG. 3 is shown how to model the function of Equation 1 in another practical layout example of adjacent polygon elements in a layout detail to arrive at a cost function depending on the width between adjacent polygons.

Initially, the layout detail is input in memory, specifically, the metal polygons structures forming an integrated circuit layout are stored by their coordinates. Generally, this is done by filling container elements accessible by a layout analyzing computer program, wherein among others, geometrical details are stored, such as their corners and edges.

In the example, the upper polygon 12 comprises corners C#1-C#4 and edges E#1, E#2; the lower polygon 13 comprises an edge E#3. First, the layout is scanned for polygon edges that create a space (or width) in the layout. These are edge pairs: for example, edge pairs (E#1, E#3) and edge pairs (E#2, E#3) in the current example. Next, a distance between the edges is calculated and this distance is taken as a reference distance $D_0$. Accordingly, particles just bigger than $D_0$ can cause a defect. In this example, not considered critical are particles (just) smaller than $D_0$. Next, a common run length L, L' is assessed between the adjacent edges, corrected with $+D_0/2$ for inward corners like corner C#1, C#2 and C#4. No correction is made for outward corners like corner #3.

In FIG. 3 a first line 14 (L) indicates a range where defects between edge #1 and edge #3 are considered. A second line 15 (L') indicates this range for edge #2 and edge #3.

Next, a cost function CF is generated depending on the distance d between the pairs of edges and common run length L, L'. This function gives the probability of a short-circuit between two adjacent tracks over a common run length L:

$$CF(d) = CF_0 - L * P0 * d^{\alpha+1}/(1+\alpha). \qquad \text{Equation 4}$$

Here 'd' is the actual distance between edges. $CF_0$ is a value calculated to ensure that $CF(\infty)$ is zero. This cost function gives the total sensitivity to defects, given a particular distribution according to modelling constant $\alpha$. Since 'd' is a property of both the input layout, as of perturbations of this layout, in the example, the cost function of equation 4 is able to predict the quality of the layout related to random particle related yield loss. Hence, in order to optimize the design the quality number assesses not only the quality of the design before optimization, but also assesses the quality of perturbations made to that design.

Although a few approximations are made this function can accurately model a random defect related cost. In particular, for jogs, some of the CF is accounted for twice (see overlapping lines L and L'). Also, corner-to-corner shorts are not accounted for and for an L-shaped space region, some CF may be accounted twice in a corner region. Accordingly, in order to assess predetermined physical characteristics such as random defect sensitivity of a predetermined set of polygons these physical characteristics are aggregated to derive an integral quality number associated to said initial circuit layout.

Figure 4:
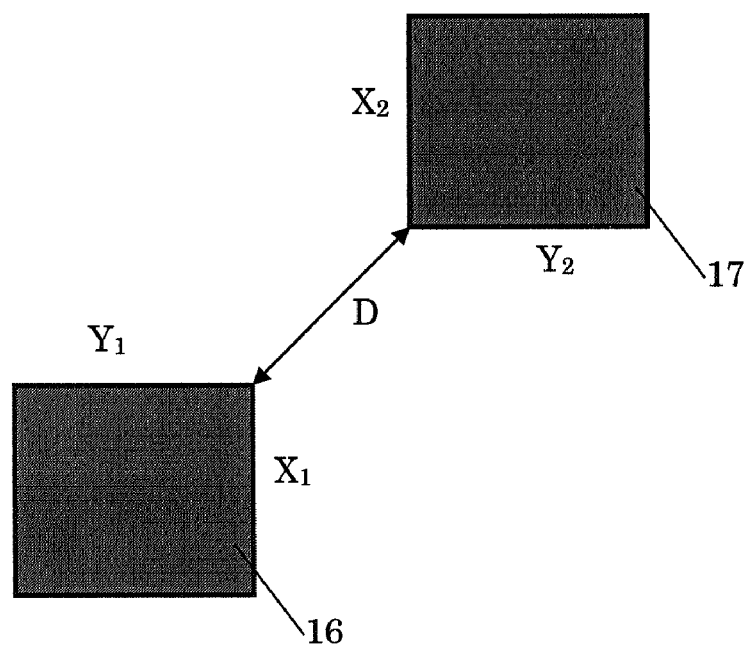
FIG. 4 illustrates the effect of a layout perturbation for two neighbouring squares in a layout detail.

Next, in FIG. 4 is illustrated another layout detail as an illustrative embodiment to calculate a cost function. Here, like in FIG. 3 adjacent polygon elements are functioning as circuit components in a layout detail of an integrated circuit. Accordingly, this layout detail is also input in memory, wherein the polygon elements are stored by their edge and corner coordinates. Here, we have a first square 16 having edge coordinates X1 and Y1, and close there to at distance D, another square 17, having edge coordinates X2 and Y2. A cost function relating the yield loss to random particle defects depends on the distance D between the adjacent squares 16 and 17. Accordingly, with reference to Equation 4 the cost function would depend on D. However, D is dependent on the edge coordinates X1, X2, Y1 and Y2. So a four-dimensional function CF(X1, X2, Y1, Y2) is related to the yield loss. Although in general cost functions could use any number of dimensions, for processing optimization a simplification can be made in the cost function. In a preferred embodiment of the invention, the cost function uses only one dimension and is made piecewise linear, to be explained below. The argument of the cost function can be calculated from edge and confer positions in the layout using any kind of linear expression. In the layout of FIG. 4 a first approximation of distance D could be expressed as $$D = 0.5 * \sqrt{2} * (-X1 + X2 - Y1 + Y2).$$

The linear expression to calculate D is often obtained by determining the direction of steepest decent of the multi dimensional cost function. In most cases this expression for D is a simple distance (width or space) between two edges of a polygon. That reflects the "simple" yield optimisation model, where yield is improved by making distances more than the minimal design rule value when there is space available in the layout. Obviously, these 'simple' optimization models are presented for illustrative purposes and the invention is not limited thereto.

Figure 5:
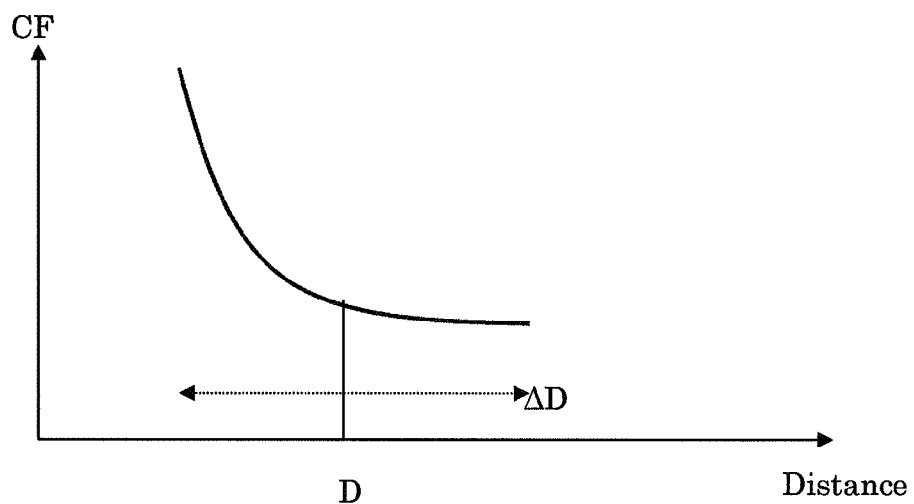
FIG. 5 shows an example cost function for the layout detail of FIG. 2.

FIG. 5 schematically shows the effect of a layout perturbation on the cost function associated with the layout in FIG. 2. Specifically, the cost function is provided by Equation 4.

An integral quality number of this layout is therefore provided by this cost function, which gives an estimated yield loss as a simple aggregated number. To assist a user or an automatic optimisation tool in optimising the layout, according to an aspect of the invention, the initial circuit layout is perturbed to evaluate a perturbed quality number of said perturbed layout; and layout perturbations are selected that optimize the quality number. Thus, in the present example, this amounts to finding a layout that has minimal total cost. Where in the example in FIG. 2 only a single layout detail is taken into account for the cost function (that is, a single "hotspot" wherein positioning of adjacent circuit elements may cause a defect), generally, in a cost function, details of many "hot spots", that is, layout details where a cost problem may be expected, are taken into account to arrive at a total aggregated cost number.

Thus, generally, this amounts to trading of an improvement of cost for one hotspot to some smaller deterioration of cost for another hotspot. For this purpose, in one aspect of the invention, the cost function is able to predict what happens to a changing layout; or in other words: a cost function is not a single number for a given layout, but a true function that can be evaluated when the layout changes. Obviously, calculation of such changing is preferably implemented in an efficient way in terms of computer run-time.

According to an aspect of the invention, optimization is done by changing the entire circuit layout, which implies changing local patterns and changing the assessed quality number. These numbers can be any combination of quality of the layout relative to different yield loss mechanisms as well as quality numbers for a single yield loss mechanism but at varying positions in the layout. The invention separates assessing these quality numbers from the actual optimisation.

Assessment of the (unapproximated) quality number can be very computationally expensive (e.g. because it involves litho simulation or circuit simulation), making the global layout optimisation infeasible. Localized assessment of the quality number can be tuned to the yield loss mechanism at hand, and is computationally more efficient.

The actual optimisation does work on the full circuit layout for instance by using polygon edge coordinates as independent variables. Since these are shared in the local quality numbers the total quality number can be used for trade off between various yield loss mechanisms. In the invention it is not relevant how the actual global optimisation is done, the concern is on how to prepare cost functions for proper trade off, and proper computation. Actual optimisation can for instance be done by linear programming (if the cost functions are convex and piece wise linear), integer linear programming (if cost functions are piece wise linear but not convex), genetic algorithms or simulated annealing (if cost functions are ill shaped) etc.

Figure 6:
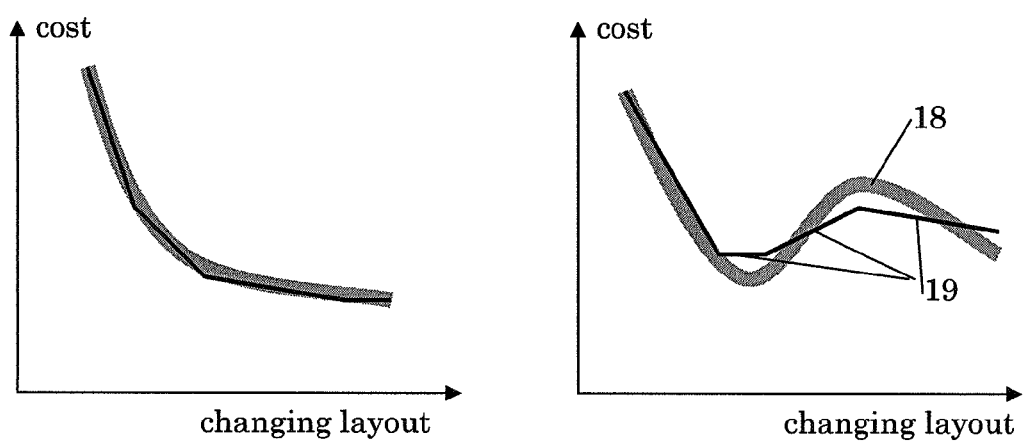
FIG. 6 shows piecewise linearized versions of cost functions similar to the function illustrated in FIG. 5.

FIG. 6 shows how the cost functions, which can have complicated shapes are provided using linear approximations. During actual optimization, an optimization program uses a piecewise linear (PWL) model for the total cost of the layout. This PWL model is chosen as a compromise between good optimisation run-time, and modelling flexibility and modelling accuracy. The aggregated cost function, for instance by adding local cost functions of a selected number of single hot spots, will be a PWL function too.

Accordingly, the figure shows examples of PWL functions. Accordingly, FIG. 5 shows a curved line 18 indicating the true cost for a layout and an approximating set of line pieces 19 generated by the optimization program.

Some constraints apply to the cost functions and PWL versions thereof: For proper optimisation (and also to reflect the physical reality) the values of cost functions preferably do not change when the total layout pattern is shifted in x or y direction.

Further, preferably, the slope of the segment that extends to infinity (to the right in the graphs) must be zero. This also reflects physical reality: when objects of a layout are spaced far apart they will not influence each other so changing their relative position will not change cost.

Preferably, the cost for infinity is zero. This is not a real limitation since all optimisation will relative to other cost values, so adding a constant to the cost does not change the optimum.

Figure 7:
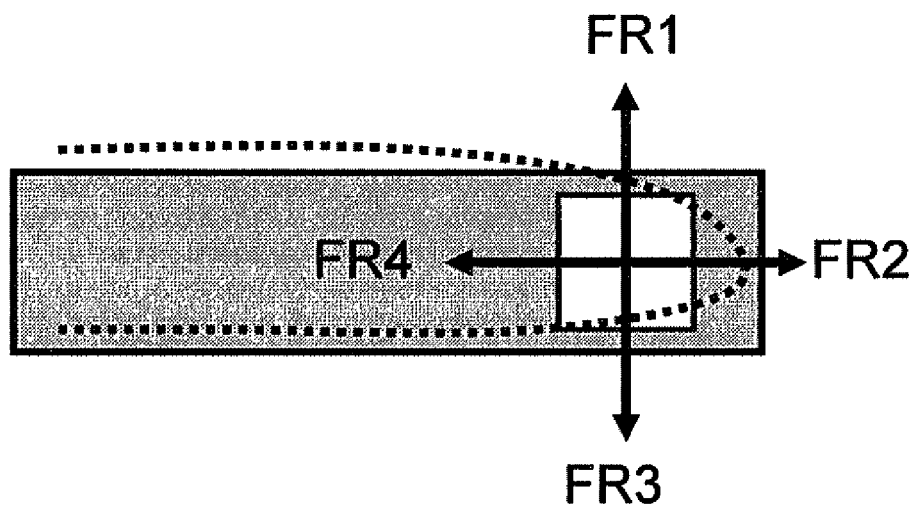
FIG. 7 illustrates schematically a cover margin analysis for providing a contact quality rating.

Next, referring to FIG. 7, another example will be discussed wherein a cost function is expressed as a function of cover margins of a target shape, of overlapping polygons, for assessing a quality number of via connections. In particular, FIG. 7 illustrates that failure ratio functions FR1 . . . FR4 are associated with a center of edges 20 of a contact area 21 on a polygon element 22. Accordingly, a cost function can be calculated for each of the contact sides individually, or all sides can be assessed according to a rating criterion. In the latter case, calculations can be simplified since the number of edges for calculating an aggregated cost function can be restricted e.g. by evaluating the cost for the side with worst coverage only. When all sides are assessed simultaneously one can have four independent cost functions which can be added together, or one can create a linear approximation for a coverage area, that is a linear approximation for the contact area that is covered by metal, or any other expression that models the physical yield loss mechanism.

Figure 8:
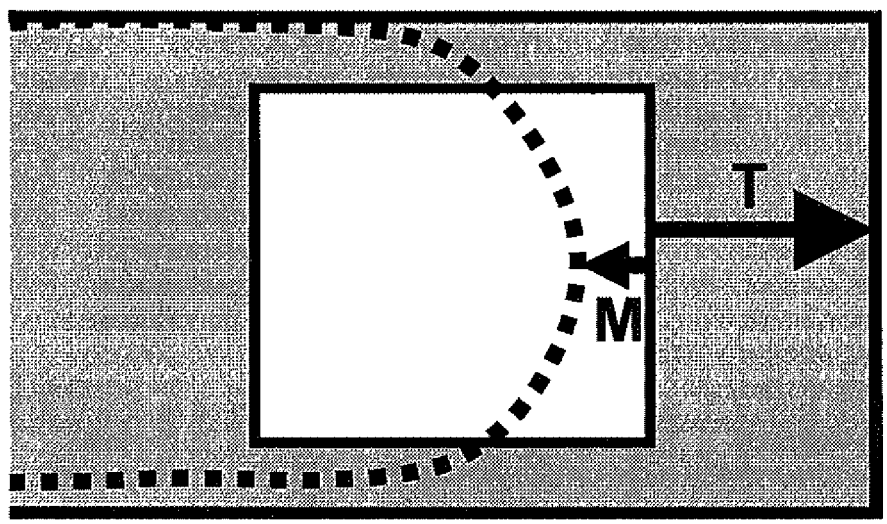
FIG. 8 illustrates schematically a cover margin analysis wherein OPC effects are taken into account.

Next, referring to FIG. 8, an example will be discussed wherein a cost function is expressed as a function of cover margins of simulated contours of polygons, for assessing optical proximity effects.

Where in FIG. 7 a cost function is calculated by margin analysis of a target shape, in FIG. 8 a margin analysis is shown wherein a contour is taken into account that has imperfections due to optical proximity effects. Accordingly, a failure ratio FR is determined based on a user function f, which can be provided by a user and reflects a failure dependency based on the cover margin T of the target shape and the cover margin M of a simulated contour. The cover margin can be negative. Through edge placement error (EPE) measurements, the values T (cover margin of target shape) and M (cover margin of simulated contour) can be calculated:

$$FR = f(T, M) \qquad \text{Equation 5}$$

Accordingly, the value T−M, also indicated as edge placement error or EPE, can be seen as the error introduced by imperfect OPC or printing issues that cause manufacturing yield loss. The function f(T,M) captures sensitivity for processing variations like changing focus or dose during the lithographic processing.

As an example, this the failure ratio function FR can be implemented as follows:
- selecting circuit components comprising single contacts or vias;
- generate single segments aligned with the contact edges;
- simulating an edge placement error attributed to these (the middle) segments (possibly for non optimal processing conditions such as focus or dose errors); and
- calculate an aggregated failure ratio function where f(T,M) is assumed to be provided as a given.

Figure 9:
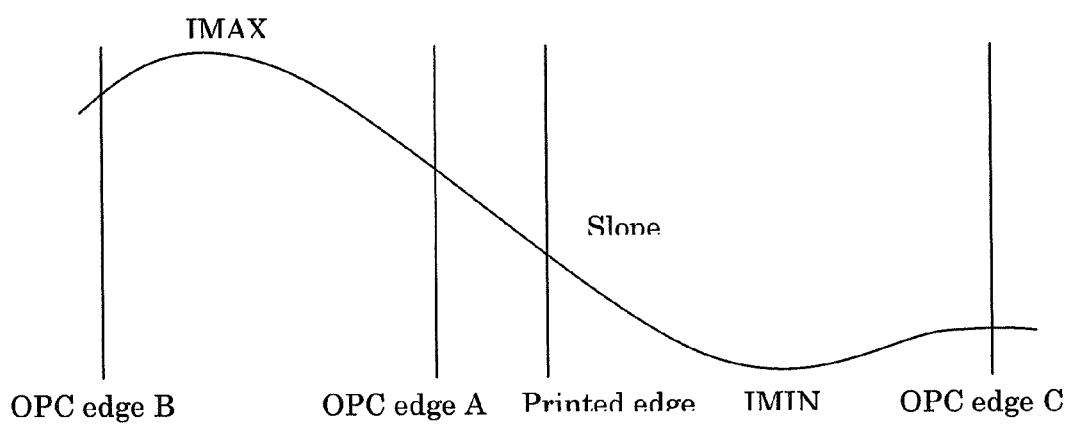
FIG. 9 illustrates a schematic intensity curve for providing contrast rating analysis.

The above illustrated quality assessment of target layout inspection, by cover margin analysis (FIG. 7), and by taking into account optical proximity correction effects (FIG. 8), can be done simultaneously or separately. Bad coverage can be caused by either OPC errors (just shape rounding in corners, tolerance errors, failure to create the right mask because of mask-rules etc). On top of this we see changing silicon images when processing is not at nominal condition. The combined yield loss can be expressed in f(T,M). Next, referring to FIG. 9, an example will be discussed wherein a cost function is expressed as a function of simulated intensities on polygon edge positions, for assessing contrast rating and printability conditions. In particular, the failure ratio can be specified as a user defined function:

$$FR=f(IMAX,IMIN,SLOPE) \quad \text{Equation 6}$$

where IMAX,IMIN are intensities that are simulated, and SLOPE is the (simulated) slope at the printed edge position.

Figure 10:
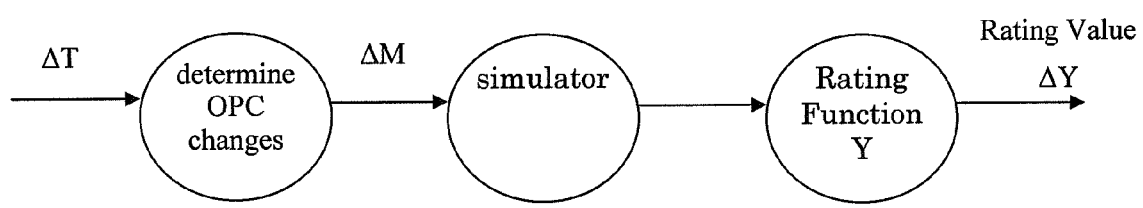
FIG. 10 illustrates schematically the steps for calculating a rating function taking into account OPC-effects.

FIG. 10 illustrates schematically the steps for calculating a rating function taking into account OPC-effects. In a first step a change $\Delta M$ is calculated in an OPC-corrected mask that results from changes in specified target edges of a target layout $\Delta T$.

This change is then supplied to a simulating unit, wherein new image properties are recalculated that are required according to a Failure Ratio function. This will result in a single rating value change $\Delta Y$. The relationship between changes in target edges and rating value will be used to formulate the required cost function. Next, the relationship of edges is determined that will produce the greatest change in Rating values. This relationship of edges will represent the direction of steepest descent within an N-dimensional space were each target edge contributes one dimension. Evaluation points will then be generated along this line of greatest decent. Both the direction and the evaluated values will form the Cost Function.

To obtain the direction of steepest descent we need to determine the change in Rating Value that results from a change of any one edge. This will be repeated for each of the target edges.

$$\frac{\Delta Y}{\Delta T1}, \frac{\Delta Y}{\Delta T2} \cdots \frac{\Delta Y}{\Delta Tn}$$

Where $\Delta Y$ is the change in yield (Rating Value) that results from a change in target edge i ($\Delta Ti$).

After the relationship of edge and Rating Value changes has been determined it may be possible to consider a users request for specific edges and/or maximum number of edges that should be used by the Cost Function. To this end the user may specify ambit boxes wherein edges that are within one of the boxes may be used by the Cost Function. In a preferred embodiment, the edges may be automatically selected that are considered to be contributing most to the Cost Function. These are the edges that have the greatest absolute value of Yield change $\Delta Y$ with target edge change $\Delta T$, for specified edges T.

Figure 11:
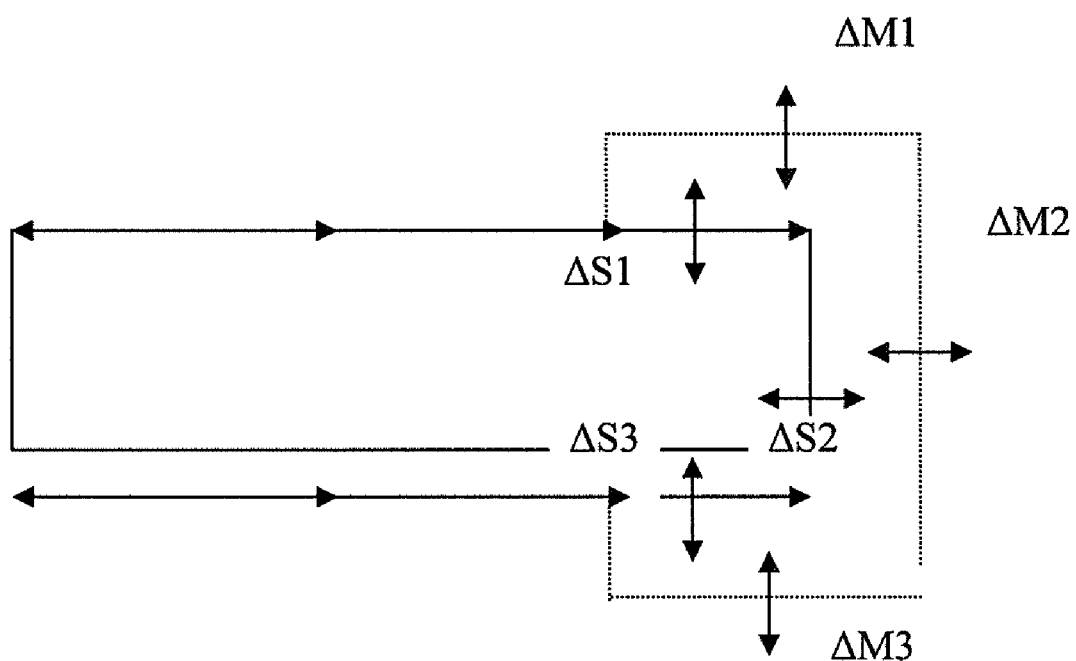
FIG. 11 illustrates schematically a change in OPC mask segments to target segments.

Next the determination of the cost function in a direction of steepest descent will be illustrated in an example, referring to FIG. 11. In particular, FIG. 11 illustrates schematically a change in OPC mask segments ($\Delta M$) to target segments ($\Delta S$). For this example initial values of edge placement errors EPE1, EPE2 and EPE3 are calculated for corresponding edges S1, S2, and S3. These values are expressed as $$EPE1(M1,M2,M3)$$

$$EPE2(M1,M2,M3)$$

$$EPE3(M1,M2,M3)$$

so that the Yield from the cost function is expressed as $$Y(M1,M2,M3)=RF(EPE1(M1,M2,M3),EPE2(M1,M2,M3),EPE3(M1,M2,M3))$$

For each of the selected segments the relationship between change in their OPC mask edge location and resulting change in their target edge location needs to be determined. This relationship, known as the Mask Error Enhancement Factor (MEEF), will be determined for each combination of target segment i with OPC mask segment j. All of the relationships will be stored within the MEEF matrix. The following dependencies are assumed:

$$\Delta M1 = \Delta T1 \times 4/3 - \Delta T3/3$$

$$\Delta M2 = \Delta T2 \times 10/9$$

$$\Delta M3 = -\Delta T1/3 + \Delta T3 * 4/3$$

When $\Delta T1=1$ and $\Delta T2=\Delta T3=0$
we have $$\Delta M1 = 4/3$$

$$\Delta M2 = 0$$

$$\Delta M3 = -1/3$$

We then supply $\Delta M1$, $\Delta M2$ and $\Delta M3$ to the simulator to obtain the new EPE1, EPE2 and EPE3 values. These new EPE values will then be given to the Rating Function to obtain the Yield. The change in Yield that results from the change in target edge $\Delta T1=1$ is then determined.

$$\Delta Y = Y(M1,M2,M3) - Y(M1+4/3,M2,M3-1/3)$$

This will generate the first term of the steepest descent vector $\Delta Y/\Delta T1$.

Say $Y(M1,M2,M3)=4$ and $Y(M1+4/3,M2,M3-1/3)=7$
then $\Delta Y/\Delta T1 = -2/-1 = 3$ When $\Delta T2=1$ and $\Delta T1=\Delta T3=0$ then $\Delta M1=0$,
$\Delta M2=10/9$ and $\Delta M3=0$.

Say $Y(M1,M2+10/9,M3)=5$ then $\Delta Y/\Delta T2=1$

When $\Delta T3=1$ and $\Delta T1=\Delta T2=0$ then $\Delta M1=1/3$, $\Delta M2=0$
and $\Delta M3=4/3$ Say $Y(M1+1/3,M2,M3+4/3)=6$ then $\Delta Y/\Delta T3=2$ Then for the cover margin example the line of steepest descent will be $$[\Delta Y/\Delta T1, \Delta Y/\Delta T2, \Delta Y/\Delta T3] = [3,1,2]$$

So we need to generate along the line $\Delta T1=3.t$, $\Delta T2=t$ and $\Delta T3=2.t$ when $t=1$, $\Delta T1=3$, $\Delta T2=1$, $\Delta T3=2$
Then $$\Delta M1 = 4 - 2/3 = 10/3$$

$$\Delta M2 = 10/9$$

$$\Delta M3 = -10/3 + 10/3 = 0$$

Then, after supplying the $\Delta M1$, $\Delta M2$ and $\Delta M3$ to the simulator, we obtain the EPE1, EPE2 and EPE3 values which we then use to obtain the Yield $$Y(M1+10/3, M2+10/9, M3)$$

We repeat the above step for valid ranges of t

Hence with the vector along steepest descent and the evaluated points of the Yield along this line we then have the Cost Function. It will be appreciated that in the embodiment using cost function analysis along a steepest descent (thus, along a multi-dimensional line of steepest decent), only a small subset of all the perturbations possible in the input layout is evaluated, but of course, in other embodiments, all possible perturbations, including non-linear dependencies, could be considered during manual or automatic optimization. However, in this embodiment, great efficiency gain is obtained by calculating this cost function that later can be used to predict changing yield when perturbing the layout.

In the figures, a focus is given on cost function analysis wherein physical characteristics are evaluated that include geometrical characteristics of said circuit layout, in particular, by storing corner and edge coordinates of polygons. However, cost function may also include non-geometrical parameters, such as material composition ratio's or the like. Furthermore, the cost function analysis not only focuses on two-dimensional variations of layout components, but may also concern height variations, in particular, where this is of interest in providing a smooth surface for chemical mechanical polishing purposes. In general, the cost functions, or quality numbers, may concern any aspect that is considered of relevance to a layout optimization, including but not limited thereto printing related predicted yield; a random defect related predicted yield; a predicted electrical circuit performance value, in particular, circuit speed and/or power consumption; a mask making related cost; a random defect sensitivity, a quality of vias connecting multiple conducting layers in the design, a quality of electrical devices in the circuit layout, and/or a electro-migration sensitivity. Furthermore, not only the optimum analysis of these aspects may be of interest, but also robustness analysis of the selected optima. The latter aspect may include higher order differential analysis of the cost functions.

The skilled artisan will appreciate that, in the context of this description, the use of the term "common run length" refers to a length measure that is defined by two adjacent edges. The term critical area refers to an area to be inspected for defects, in particular, an area which provides correct electrical functioning in terms of providing an electrical connection or an electrical isolation and is formed by adjacent edges and a common run length. Hence, critical areas are defined by polygons areas that make up a layout detail of an integrated circuit. Polygons, throughout the application, refer to entities in the forms of polygons, used to define physical entities on a substrate, that in combination provide and define the functioning of a (micro) electric circuit. In addition, piece wise linear (PWL) functions may be characterized as a set of linear functions, each of which is valid between fixed boundaries, and wherein the boundaries are annexed to provide a continuous (in the standard mathematical meaning) or almost continuous function over an entire region formed by said annexed boundaries. The terms "perturbing", "pertubation" etc. are used in its standard mathematical meaning but also may concern small variations, in particular, in the layout geometry of a layout to be analyzed, generated automatically or manually. The PWL functions can be used to approximate, up to a predefined criterion, a non-linear cost function.

While specific embodiments of the invention have been described above, it will be appreciated that the invention may be practiced otherwise than as described. In particular, the descriptions above are intended to be illustrative, not limiting. Thus, it will be apparent to one skilled in the art that modifications may be made to the invention as described without departing from the scope of the claims set out below.

The invention claimed is:

1. A computer-implemented method of creating a global integrated circuit layout comprised of a number of polygons having a predetermined geometrical relation relative to each other, comprising:
    providing, by computer processor, an initial global integrated circuit layout wherein the global integrated circuit layout is provided by storing corner and edge coordinates of polygons representing the shapes of a local pattern;
    assessing local quality numbers, each as a function of the corner and edge coordinates of a local pattern of polygon shapes in said initial global integrated circuit layout;
    aggregating approximated functions of said local quality numbers, to derive an integral quality number associated to said initial global integrated circuit layout, wherein said approximated function is provided as linearly dependent on said corner and edge coordinates;
    perturbing said integral quality number by varying said corner and edge coordinates of said polygons in a global integrated circuit layout; and
    selecting perturbations of said corner and edge coordinates of said polygon shapes that improve the integral quality number, so as to optimize said global integrated circuit layout.

2. A method according to claim 1, wherein said integral quality number represents a printing related predicted yield; a random defect related predicted yield; a predicted electrical circuit performance value; a mask making related cost; a random defect sensitivity, a quality of vias connecting multiple conducting layers in the design, a quality of electrical devices in the circuit layout, and/or a electro-migration sensitivity.

3. A method according to claim 2, wherein said predicted electrical circuit performance is related to circuit speed and/or power consumption.

4. A method according to claim 1, wherein the initial global integrated circuit layout includes geometrical characteristics.

5. A method according to claim 1, wherein said approximated functions are provided by evaluating local quality numbers on perturbations on the local pattern of shapes, so as to assess approximated function values of said local quality numbers.

6. A method according to claim 1, wherein a linear dependency on said corner and edge coordinates is provided by determining a direction of steepest descent of a multi dimensional local quality number.

7. A method according to claim 1, wherein said approximated function is provided as a piecewise linear function.

8. A method according to claim 1, wherein said approximated function is provided as a quadratic function.

9. A method according to claim 1, wherein said local quality number is expressed as a function of cover margins of a target shape, of overlapping polygons, for assessing a quality number of via connections.

10. A method according to claim 1, wherein said local quality number is expressed as a function of cover margins of simulated contours of polygons, for assessing optical proximity effects.

11. A method according to claim 1, wherein said local quality number is expressed as a function of simulated intensities on polygon edge positions, for assessing contrast rating.

12. A method according to claim 1, wherein said local quality number is expressed as a function of distance and common run length between adjacent polygons, for assessing random defect sensitivity.

13. A method according to claim 1, wherein said local quality number is expressed as a function on predicted integrated circuit transistor parameters.

14. A method according to claim 1, wherein said global integrated circuit layout is generated deterministically by a set of parameters, and wherein said perturbations are provided by perturbation of said parameters.

15. A method according to claim 1, wherein said global integrated circuit layout is varied by varying the local pattern of shapes or approximated functions.

16. A computer program product, comprising program code portions for performing steps of a method as claimed in claim 1, when run on a programmable apparatus.

17. An article of manufacture with a non-transitory computer usable medium having computer readable instructions therein for providing access to resources available on that computer, the computer readable instructions comprising to cause the computer to perform the steps of a method as claimed in claim 1.

18. A system for creating an integrated circuit layout, comprising:
- an input for receiving an initial global integrated circuit layout, the input adapted to store corner and edge coordinates of polygons representing the shapes of a local pattern;
- a processing circuit arranged to
  - assess a function of the corner and edge coordinates of said initial global integrated circuit layout, to derive an integral quality number associated to said initial circuit layout as an aggregated function of local quality numbers, each as a function of the corner and edge coordinates of a local pattern of polygon shapes wherein said approximated function is provided as linearly dependent on said corner and edge coordinates;
- perturb said integral quality number by varying said corner and edge coordinates of said polygons in a global integrated circuit layout; and
- select perturbations of said corner and edge coordinates of said polygon shapes that improve the integral quality number; and an output for outputting said selected perturbations.

* * * * *